United States Patent [19]

Whitten

[11] Patent Number: 4,796,075
[45] Date of Patent: Jan. 3, 1989

[54] FUSIBLE LINK STRUCTURE FOR INTEGRATED CIRCUITS

[75] Inventor: Ralph G. Whitten, San Jose, Calif.

[73] Assignee: Advanced Micro Devices, Inc., Sunnyvale, Calif.

[21] Appl. No.: 852,473

[22] Filed: Apr. 15, 1986

Related U.S. Application Data

[63] Continuation-in-part of Ser. No. 564,439, Dec. 21, 1983, abandoned.

[51] Int. Cl.$^4$ ............. H01L 27/02; H01L 29/34; H01L 23/48
[52] U.S. Cl. ............................. 357/51; 357/54; 357/67; 357/71
[58] Field of Search ................. 357/51, 54, 67, 71

[56] References Cited

U.S. PATENT DOCUMENTS

| | | | |
|---|---|---|---|
| 4,135,295 | 1/1979 | Price | 357/51 |
| 4,209,894 | 7/1980 | Keen | 357/51 |
| 4,288,776 | 9/1981 | Holmes | 357/51 |
| 4,328,262 | 5/1982 | Kurahashi et al. | 357/51 |
| 4,413,272 | 11/1983 | Mochizuki et al. | 357/51 |
| 4,420,504 | 12/1983 | Cooper et al. | 357/51 |
| 4,481,263 | 11/1984 | Cooper et al. | 357/51 |
| 4,502,208 | 3/1985 | McPherson | 357/51 |

FOREIGN PATENT DOCUMENTS

| | | |
|---|---|---|
| 58-131764 | 8/1983 | Japan . |
| WO83/01866 | 5/1983 | PCT Int'l Appl. ............ 357/51 |

OTHER PUBLICATIONS

S. P. Murarka, "Refractory Silicides for Integrated Circuits," *Journal of Vacuum Science and Technology*, vol. 17 (1980), pp. 775-792.

Primary Examiner—J. Carroll
Attorney, Agent, or Firm—Alan H. MacPherson; Paul J. Winters; Norman R. Klivans

[57] ABSTRACT

A fusible link structure and method of making the same for use in integrated circuit structures is provided in which the fusible link comprises, in one embodiment, an alloy of platinum and silicon. The preferred alloy comprises the eutectic mixture having approximately 23 atomic percent silicon. Electrical connections to the fusible link are preferably provided by a layer of aluminum on a layer of material, preferably an alloy of titanium and tungsten wherein the titanium and tungsten alloy is disposed between the fusible link and the aluminum layer, and serves as a diffusion barrier for preventing diffusion of the aluminum into the fusible link. In a preferred embodiment, a fusible link is deposited on a relatively thick dielectric layer, preferably more than 10,000 Å thick, having a relatively low thermal conductivity. The preferred method of depositing the fusible link is sputtering from a target comprising the platinum-silicide alloy, thus achieving a fuse element having uniform composition throughout its cross section. A fuse of this type has high reliability, requires low fusing current, and is dielectrically encapsulated sealed within the integrated circuit structure.

15 Claims, 4 Drawing Sheets

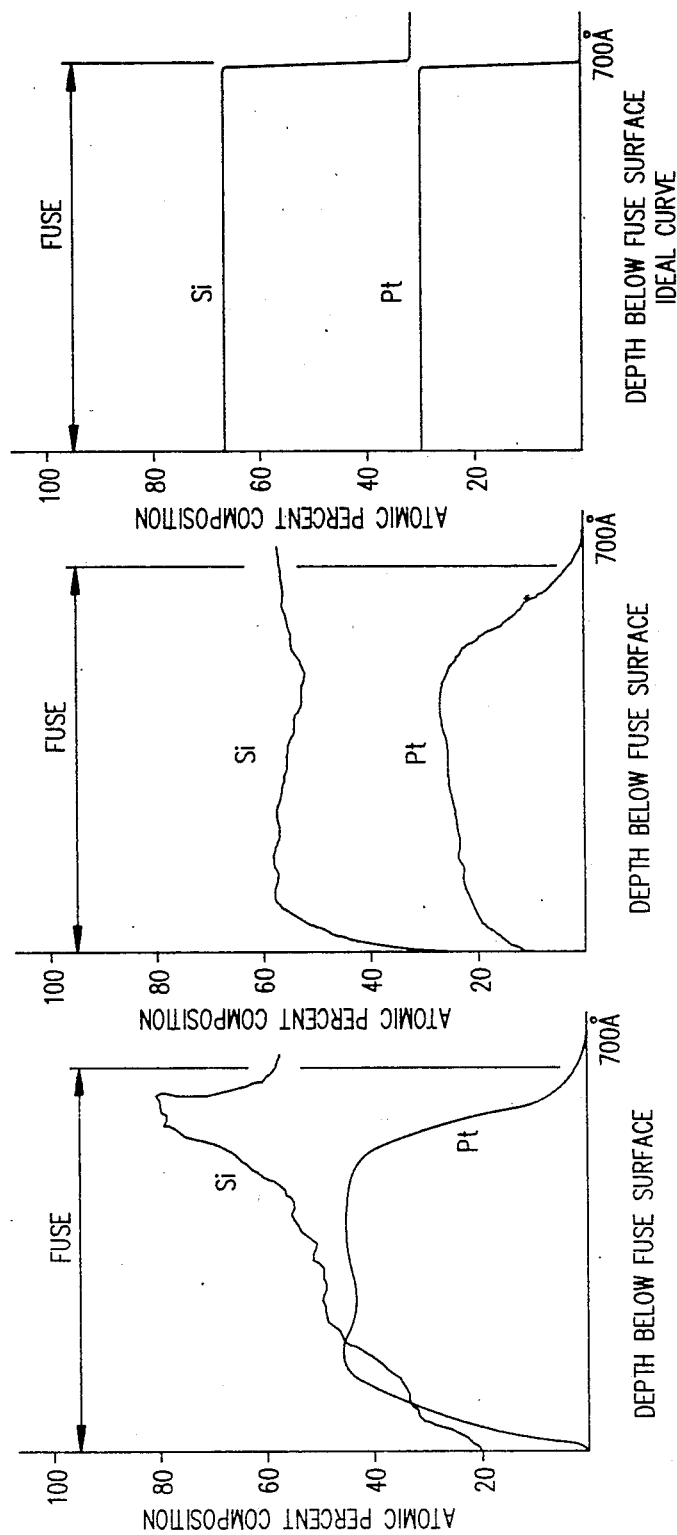

PLATINUM SILICON ALLOY
SINTERED FUSE AS IN FIG. 5

23% BY WEIGHT SILICON,
77% BY WEIGHT PLATINUM SPUTTERED
FUSE MATERIAL EQUIVALENT TO
67 ATOMIC PERCENT SILICON
AS IN FIG 6

FUSIBLE LINK STRUCTURE FOR INTEGRATED CIRCUITS

BACKGROUND OF THE INVENTION

This is a continuation-in-part of application Ser. No. 06/564,439 filed Dec. 21, 1983 abandoned.

The present invention relates to fusible link structures in general, and in particular to a silicide fusible link structure suitable for use in a field programmable, custom logic, integrated circuit, such as a programmable read-only memory (PROM) and a programmable logic array circuit.

PROMS and programmable logic array circuits employ a means which can be modified to provide a predetermined arrangement of electrically interconnected circuit elements. A PROM, prior to being programmed comprises a uniform array of identical memory cells. In programming the PROM, certain memory cells are modified, for example by opening fuses connecting them to other circuit elements, so that upon reading the PROM, the modified cells provide one kind of output signal such as a logical "1" and the unmodified cells provide another kind of output signal such as a logical "0".

Similarly, a programmable logic array circuit, prior to being programmed, comprises a uniform array of circuit elements. In programming the array, electrical connections between certain ones of the circuit elements are either left intact or broken to thus provide a custom logic circuit. An example of a programmable logic array circuit referred to herein is the PAL family of programmable logic array circuits manufactured by Monolithic Memories, Inc., of Santa Clara, Calif., the assignee of this application. PAL is a registered trademark of Monolithic Memories, Inc.

The present invention, being directed to a unique fusible link structure and method of making the same is most closely related to those programmable integrated circuit structures which are programmed by destroying or otherwise interrupting electrical connections between certain circuit elements in the structure.

In general, a fusible link structure comprises a conductive member for electrically interconnecting a pair of circuit elements. The conductive member may comprise a number of different types of materials having predetermined electrical characteristics, commonly called fuse blowing characteristics. When it is desired to interrupt or break the interconnections, a current of selectedl magnitude and duration is passed through the conductive member. The conductive member, typically comprising a resistive element, is thus caused to disintegrate or fracture and thereby become an open circuit.

It has not previously been recognized that it is desirable to provide a fuse having a low melting point. Accordingly, widespread use has been made of tungsten-titanium fuses, having a very high melting point (typically 3300° C.). Nichrome fuses have also been used, which have lower melting temperatures than tungsten-titanium, but which suffer from being difficult to fabricate consistently and highly prone to chemical attack. Platinum silicide fusible links have also been made using various compositions of platinum and silicon. In the fabrication of the prior known platinum silicide fusible links, the compositions were formed by sintering a layer of platinum and an underlying layer of silicon to form predefined platinum silicide fuse regions. The resulting fuses were often found to have a melting point as high as 1229° C. With a melting point of 1229° C., a relatively high current and voltage were required to "blow" the fuse. FIG. 4, taken from "Constitution of Binary Alloys" by Max Hansen, Copyright 1958, McGraw Hill Book Company, shows melting point of platinum silicide alloys as a function of composition and shows three eutectic mixtures at 23, 39, and 67.5 atomic percent silicon (4.2%, 8.4% and 23% by weight) having melting points of 830° C., 983° C., and 979° C., respectively. It has not previously been recognized that forming fuses from a uniform mixture of one of these eutectic mixtures would allow the fuse to blow at a lower temperature and would thus improve fuse performance.

It has also not been previously recognized that it is desirable to provide a fuse structure having a uniform melting point throughout its cross section. It was found that the fuse blowing characteristics were often inconsistent and varied over an undesirably wide range of current and voltage. These undesirable characteristics are, at least in part, attributed to the formation of non-homogenous, nonuniform compositions of silicide by the conventional methods used in the fabrication of the prior known silicide fuses, regardless of the type of silicide used. Thus these problems exist for prior art platinum silicide fuses, prior art tungsten silicide fuses, etc.

It is known that more uniform structures can be achieved by cosputtering than by sintering. An article by S. P. Murarka, entitled "Refractory Silicides For Integrated Circuits", J. Vac. Sci. Technology, 17(4), Jul./Aug. 1980, and incorporated herein by reference, provides a chart on page 781 showing the uniformity characteristics of various processes, including cosputtering onto silicon, polycrystalline silicon, or oxide, from a hot pressed silicide target. Murarka states on page 780 that cosputtering from two independent targets is preferred for controlling the metal to silicon ratio. Even though a method is known for forming uniform silicide films, it has not been recognized that such uniformity is important for the formation of fuses. The Murarka article was published in 1980, yet prior to this invention no application of cosputtering or sputtering from a silicide target has been made for forming fuses. The industry continues to use other methods, for example chemical vapor deposition to deposit a layer of polycrystalline silicon onto oxide, evaporation to deposit a layer of nichrome, sputtering to deposit a layer of titanium-tungsten onto a layer of oxide, and sputtering from a platinum target to deposit a layer of platinum onto a layer of polycrystalline silicon and subsequently sintering the structure to form a platinum silicide fuse. For example, Schlupp, in P.C.T. Patent Publication WO No. 83/01866 published in May 1983, and incorporated herein by reference, describes a platinum silicide fuse structure in which platinum is deposited above polycrystalline silicon and sintered. Schlupp teaches leaving a layer of polycrystalline silicon below the silicide alloy in order to make good diodes.

FIG. 5 shows the composition of platinum and silicon as a function of depth below the surface in a sintered platinum silicide test fuse structure formed by a method such as that of Schlupp. In FIG. 5, a layer of platinum 190 Å thick was deposited on a 500 Å polycrystalline silicon substrate. The structure was then sintered at 550° C. for one-half hour. FIG. 5 shows that the composition within about 450 Å of the surface is fairly uniform platinum silicide, whereas the region from 450 to about 700

Å below the surface is rich in silicon. Below 700 Å, FIG. 5 shows the oxide layer beneath the fuse layer. An ideal structure would have a uniform mixture of platinum and silicon throughout the depth of the fuse, as shown in FIG. 7. The nonuniform structure of FIG. 5 does not melt at a uniform temperature throughout its depth when a fusing current is passed through it. As shown in FIG. 4, in the case of platinum silicide, melting point varies from 830° C. for a eutectic mixture of 23 atomic percent (4% by weight) silicon to 1769° C. for pure platinum and 1412° C. for pure silicon.

Thus in a nonuniform fuse, such as that shown in FIG. 5, during the short fusing pulse the uppermost portions of a fuse which have a near eutectic mixture will melt, separate and pull back, due to surface tension, and leave the lowest portions of the fuse structure, having a composition approaching pure polycrystalline silicon (and thus having a melting point over 1000° C.) unmelted. Since this unmelted material is conductive, the fuse would remain partially intact under fusing current, voltage and time that would completely separate a uniform fuse. For integrated circuit structures, fuse blowing reliability cannot be compromised. If one fuse in a million fails, 6% of 64K PROMs on the average will fail, producing an unacceptable yield, thus some action is needed to achieve complete fuse blowing such as higher current or voltage or longer fusing time.

The incomplete separation of fuses has been recognized in the past. Other fuse manufacturers have solved the problem of a remaining conductive path by leaving an air gap above the fuse. For example, David W. Greve, "Programming Mechanism of Polysilicon Resistor Fuses", *IEEE Transactions on Electron Devices,* Vol. ED-29, No. 4, Aril 1982, pp 719–724, incorporated herein by reference, described the fuse-opening mechanism in polysilicon fuses and states on pg 724, "Our experiments have shown that is is necessary to remove the passivation layer over the fuse to obtain reasonable programming currents." One theory is that in a partially melted fuse, the air in this air gap will oxidize the remaining silicide, forming nonconductive silicon oxide, thus achieving an opened fuse which will not conduct. However, air gaps cause problems in the packaging and reliability of the integrated circuit structure. Greve states on pg 724, "For this reason, bipolar PROM's with polysilicon fuses are packaged in hermetically sealed ceramic packages [1] at additional expense." Sealing, which can be done with either ceramic packages or applying low temperature glass to the integrated circuit wafer during the final fabrication steps, is necessary to protect the integrated circuit from moisture and other contaminants, such as sodium ions, which can cause corrosion, leakage, instability, or other failures.

Another solution to the nonuniformity problem might be to sinter the metal-on-silicon structure at a higher temperature for a longer time, thus achieving a fair degree of uniformity. However, at a higher sintering temperature other devices including Schottky junction devices and shallow junction devices are destroyed or degraded, thus higher temperature sintering is not acceptable for most integrated circuit structures. In some cases even the uniformity attained by sintering can be detrimental to Schottky diodes, as taught by Schlupp at page 5, line 19 to page 6, line 18.

In addition to the problems associated with the use of nonhomogenous and nonuniform slicide films in prior art silicide fuse structures, it has also been determined that silicide fuse structures as well as other types of fuse structures, e.g., titanium-tungsten and polycrystalline silicon fuse structures suffer from heat dissipation during blowing of the fuse due to the thermal conductivity of the material contiguous with the fuse. The effect of thermal gradients can be reduced by reducing the temperature gradient within the adjacent dielectric. A thicker dielectric layer serves this purpose. Holmes, in U.S. Pat. No. 4,288,776 suggests at col. 1, lines 51–55, using thick dielectric to allow for laser trimming, but says nothing about the benefit of thicker oxide adjacent to fuses for the purpose of reducing fuse heat loss during fuse blowing.

Low blowing current and voltage are important for increasing fuse opening reliability. For a given circuit having given voltage and current values, the margin of safety can be increased. Also there is a need to make fusing power requirements smaller so that other circuit elements can in turn be made smaller without compromising fuse blowing reliability.

SUMMARY

For the foregoing reasons, in accordance with the present invention a novel fusible link structure is provided having lower programming currents and voltages than any previously attained. This structure is suitable for use in programmable integrated circuits which are to be packaged in either ceramic or plastic. The fuse structure of this invention will not cause degradation of other devices in the integrated circuit. In addition, a novel method is provided for fabricating the novel structure of this invention.

Among the features of the present invention provided to achieve the above objects are 1. a fusible link structure and method in which uniform, homogenous films of fuse material are deposited on a substrate body;

2. a fusible link structure and method comprising a low melting point alloy of metal and silicon; and 3. a fusible link structure and method in which a relatively thick layer of dielectric of low thermal conductivity is provided contiguous with the fuse for controlling the magnitude of thermal gradients in the dielectric and heat loss from the fuse.

In order to achieve a uniform, homogenous fuse film for reliable fuse blowing, a principal feature of the present invention is the use of sputtering from a target already having the desired fuse composition for depositing onto the surface of suitably prepared dielectric material the uniform, homogenous film of fusible material.

In order to achieve a fuse which can blow at low current and voltage, another feature of the present invention is that the fusible material has a uniform low melting point, thereby requiring a low fusing current. The low fusing current allows device size to be minimized and thus reduces signal delay times. Even small reductions in fusing current allow reducing the size of the associated fusing circuitry, thereby decreasing chip size and signal delay time. In a preferred embodiment, the fusible material used is an alloy of platinum and silicon, also called a silicide, comprising approximately 23 weight percent silicon, which is a eutectic mixture of silicon and platinum.

To avoid loss of fusing energy from the fuse, the low thermal conductivity of the adjacent dielectric is taken advantage of by making the dielectric thicker. Typically a dielectric integrated circuit structure is prepared in accordance with this invention by growing on the surface of semiconductor material a layer of silicon oxide, or depositing a composite layer of silicon nitride and silicon oxide, polyimide, or other dielectric of low thermal conductivity, e.g., 14 milliwatts/cm° C. for silicon dioxide. Preferably the layer of oxide, nitride, or polyimide which underlies the fuse material should have a thickness above 10,000 Å, or in some cases 16,000 Å thereby providing good thermal insulation so that a lower product of fusing current and fusing time will bring the fuse to melting temperature.

The process includes deposition of a second dielectric layer over the fuse. Unlike prior art platinum silicide structures having nonuniform fuse composition and requiring an air gap to assure reliable fuse blowing at moderate current, the structure of this invention operates reliably with no air gap, thus not compromising either the fuse blowing reliability or the resistance to corrosion or other failure-producing contamination. Although it is possible to seal a programmable structure having air gaps remaining within it, as indicated by Greve, above, the manufacturing process is simpler and the product more reliable if no air gaps are provided adjacent to fuse sites.

By controlling the size and shape of the fuse structure and the exact composition of the fuse material, the structure can be tailored for a desired resistance, with reduced blowing current and voltage.

Using the above described structure and method of fabrication, there has been achieved in the fabrication of a fusible link according to the present invention in comparison to prior art structures, a 60–70% reduction in fuse blowing current and a 10–15% reduction in fuse blowing voltage. Specifically, fuse blowing currents of approximately 15 to 20 ma and fuse blowing voltages of approximately 2.3 to 2.8 volts have been achieved compared to typical prior art fuse blowing currents of 55 to 60 ma and fuse blowing voltages of 3.0 volts. Importantly, the fuse structures of this invention can have surprisingly uniform fuse blowing characteristics.

BRIEF DESCRIPTION OF THE DRAWINGS

The above and other objects, features and advantages of the present invention will become apparent from the following detailed description of the accompanying drawing in which:

FIG. 5 shows composition as a function of depth below the surface for a prior art sintered platinum-on-silicon fuse structure.

FIG. 6 shows a composition distribution achievable using the method of this invention.

FIG. 7 shows an ideal composition distribution for a PtSi fuse structure on a silicon substrate.

DETAILED DESCRIPTION

Figure 1:
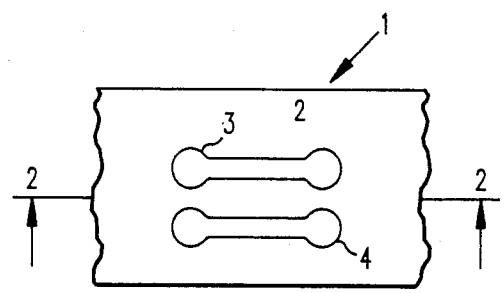
FIG. 1 is a partial plan view of a fusible link structure on the surface of a suitably prepared integrated circuit substrate body according to the present invention.
Figure 2:
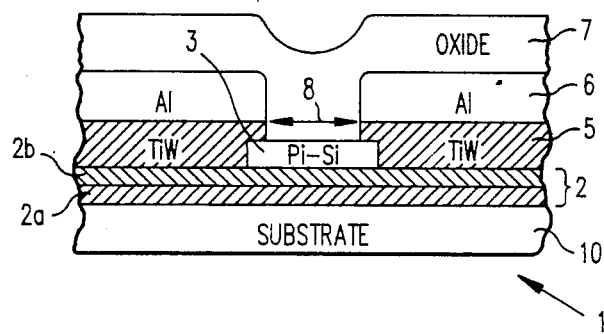
FIG. 2 is a partial cross-sectional view taken along the lines 2—2 of FIG. 1.

Referring to FIGS. 1 and 2, there is provided in accordance with one embodiment of the present invention, a suitably prepared integrated circuit designated generally as 1. The integrated circuit 1, of which only a very small portion is shown in FIG. 1, typically comprises a silicon substrate 10 in which has been formed a plurality of active devices such as memory cells and/or logic circuits (not shown).

The surface of the substrate 10 has deposited or formed on it a thick layer 2 of silicon oxide, a thick composite layer of silicon nitride and silicon oxide or a thick layer of other suitable insulating material, such as polyimide. Preferably, layer 2 comprises a relatively thick layer 2a of thermally grown silicon oxide greater than 10,000 Å thick on which may be deposited, for example by chemical vapor deposition, a layer 2b of silicon nitride typically 1200 Å thick. The thermal conductivity of layer 2 should be low, e.g., approximately 14 milliwatts/cm° C. or less.

Figure 4:
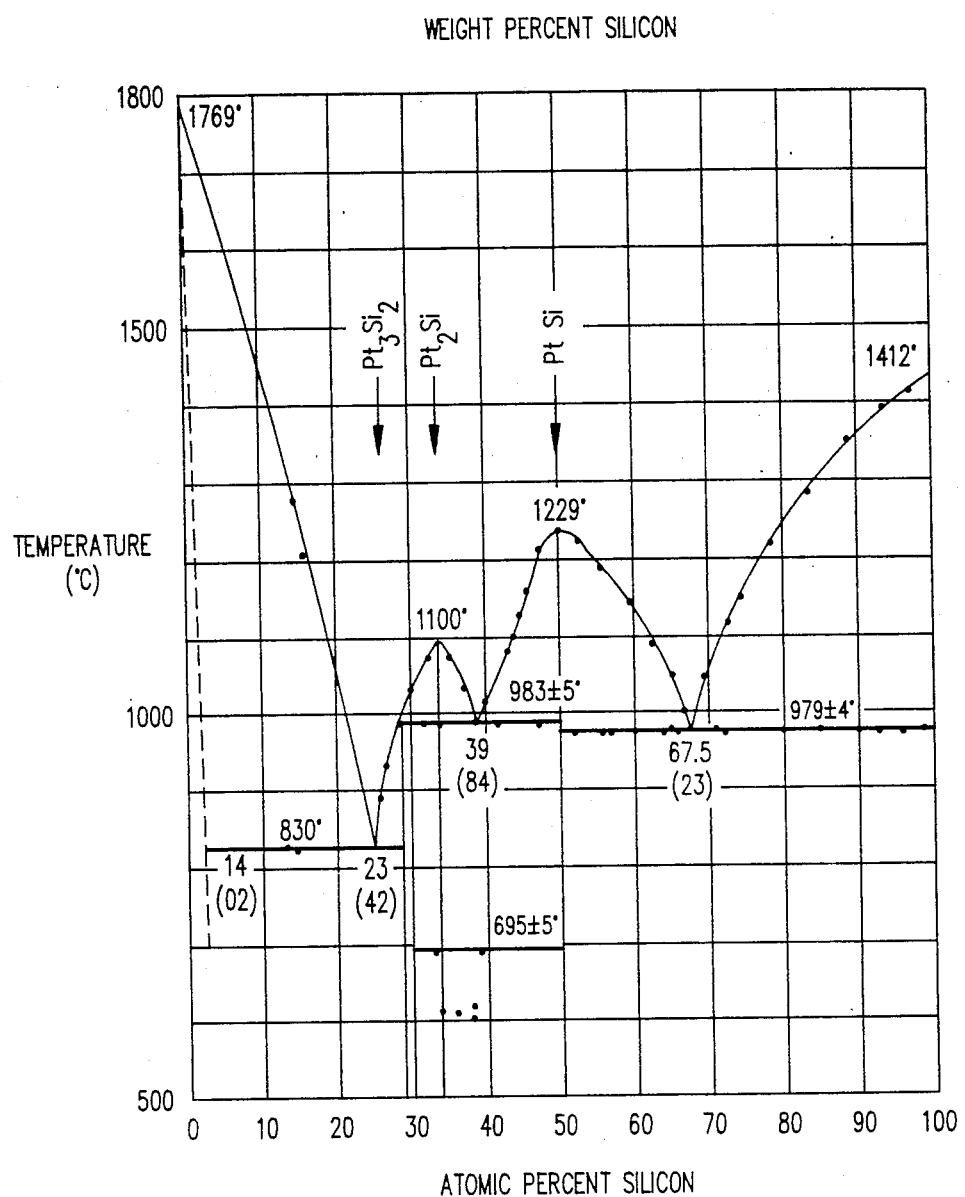
FIG. 4 is a prior art graph depicting the melting point of platinum-silicon composition as a function of percent silicon.

After the layer 2 is formed on the substrate 10, a thin film 3 of an alloy from a composite target, preferably of platinum and silicon comprising approximately 23 weight percent silicon, is R.F. sputter deposited onto the surface of the layer 2. It was found that the PtSi composition and homogeneity of fuse link 3 is critical. Only a small difference in the percentage of the component parts of the composition can result in a large variation in the melting point of the composition, e.g., several hundred degrees centigrade. A graphical representation of the melting point of a platinum-silicon composition as a function of a percent silicon, taken from "Constitution of Binary Alloys" by Max Hansen, Copyright 1958, McGraw-Hill Book Company, is shown in FIG. 4. The 23 weight percent composition is preferred. Although there are three eutectic compositions of platinum and silicon, as shown in FIG. 4, the composition having 23 weight percent silicon (67.5 atomic percent silicon) and a melting point of 979+ C. is chosen because the resistivity of this composition is stable at 180 $\mu$ohm-cm and the slope of the curve toward the eutectic point is less steep and thus the manufactured composition has a more reliable melting point. Typical manufacturing tolerances are ±2.3%. The sputtering is done using a target comprising a cold-pressed sintered powder composition of platinum and silicon, having the desired composition of approximately 23 weight percent silicon as described above, in an argon atmosphere using an R.F. signal having a frequency of 13.56 MHz. FIG. 6 shows the composition distribution of PtSi fuse structure 3 when formed by this method. It approximates the ideal curve of FIG. 7 much more closely than does the prior art method shown in FIG. 5.

Thereafter, using conventional photolighographic techniques and etching, for example reactive ion etching in a tetrofluoromethane atmosphere, individual discrete fusible links are formed on thick dielectric layer 2. One etch process uses an etch bias power of 1200 watts, a pressure of 7 millitorr and flow rates of 40 standard cc/min tetrafluromethane and 10 standard cc/min of oxygen. These fusible links can have any desired shape, although an hourglass shape or a rectangular bar shape are preferred. In one embodiment each hourglass shaped fuse was 11–14 $\mu$ long, 4–6 $\mu$ wide at its ends and about 1.5 $\mu$ wide in the middle. The fuse links 3 and 4 shown in FIGS. 1 and 2 illustrate typical fuses formed in accordance with this invention. Etching is complete when the silicide is completely removed except where fuses are to be formed.

After the etching step, the photoresist covering the fuse links is removed and the remaining silicide is sintered to attain its final resistivity of approximately 180 μohm-cm. The sintering is performed at 550° C. for 10 minutes in a nitrogen atmosphere. The final resistance of each fuse is in the range of 35 to 70 ohms. However, it is to be understood that this sintering step is not essential but, if not performed, the fuses will have higher resistivity and thus a greater programming voltage will be required.

With the present method, using a target of uniform alloy composition for sputtering the fusible link film onto the dielectric substrate followed by sintering the film at a controlled temperature for a controlled time it is possible to accurately tailor the resistivity of the fusible film for the conditions under which it will be used. In most circuit applications, low resistance fuses (i.e. 35 ohm) are preferred to provide the lowest programming voltage and shortest circuit delay.

Electrical contact is then made to the opposite ends of each fusible link by a D.C. sputter deposition in an argon atmosphere of a titanium-tungsten (TiW) diffusion barrier layer 5 followed by a layer of aluminum or aluminum alloy 6. The TiW layer 5 typically comprises an alloy comprising 10% titanium and 90% tungsten, by weight, though these percentages are not critical. A typical thickness of the layer 5 is within the range 1050 to 1350 Å. The aluminum layer 6 is typically 7200 Å to 8800 Å thick.

The diffusion barrier 5 is disposed between the aluminum layer 6 and the fusible link 3 in order to prevent diffusion of the aluminum into the fusible link 3 which would change the resistance thereof. Of importance, the titanium-tungsten diffusion barrier 5 has a very high melting point and is very stable, and thus does not diffuse into the fusible link. Other metals which will not diffuse into the fusible link and which have high melting point can of course be used.

Following the deposition of the diffusion barrier 5 and the aluminum layer 6, the layers 5 and 6 are etched, for example using a hydrogen peroxide etch and a conventional metal etch, respectively. The etching of the layers 5 and 6 is done to provide a gap 8 thereon 2–7 microns wide over the center of each fuse 3. The shorter length is preferred, to decrease overall space requirements. After the layers 5 and 6 are etched, there is deposited, such as by chemical vapor deposition, a dielectric oxide layer 7 which is approximately 9000 Å–10,000 Å thick. The dielectric layer 7 is provided to electrically insulate the fusible link 3, the diffusion barrier 5 and the aluminum layer 6 from subsequently deposited conductive layers.

It is not always necessary to form thick dielectric layers on top of the fuse; in applications where material of high thermal conductivity will not be used above the dielectric any dielectric layer of convenient thickness can be used. The reason for this is that dielectric layers, such as silicon oxide or silicon nitride, have a higher thermal conductivity and thermal capacity than the ambient atmosphere surrounding the integrated circuit. However, if metal interconnects are to be formed above the fuses, it is desired to have a relatively thick dielectric formed between the fuse and the metal interconnects to minimize heat dissipation from the fuse to the overlying metallization.

After the deposition of the dielectric oxide layer 7, the integrated circuit is, if desired, subjected to additional conventional processing steps including, for example, forming a second metallization layer and a glass passivation layer (not shown). Vias (not shown) are provided through oxide layer 7 to connect conductive layers 5, 6 to current sources (not shown) in order to allow the fuse to be blown at the appropriate time. Vias are also necessary to connect the fuses to underlying active circuit elements.

Figure 3:
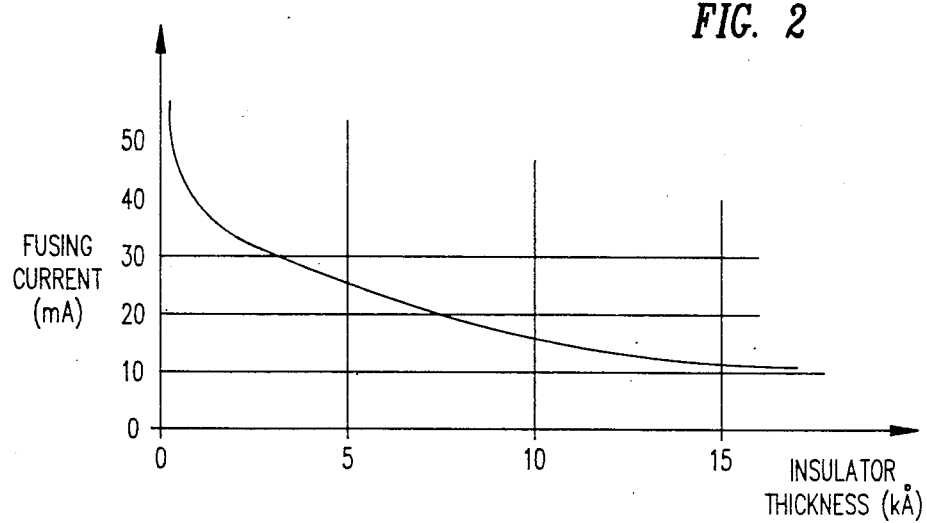
FIG. 3 is a graph depicting the fusing current required as a function of thickness of the oxide underlying the fuse.

A fusible link structure made in accordance with this invention blows at a much lower current and voltage than do prior art fuses due to the greatly reduced melting point of the platinum-silicon eutectic used in accordance with this invention as compared with prior art fuse structures and because the structure beneath the fuse minimizes heat flow away from the fuse 3 and thus reduces the power required to melt the fuse 3. To minimize the heat flow away from the fuse 3, the thick dielectric layer 2 comprises a material having a relatively low thermal conductivity as described above. FIG. 3 is a graph depicting the fusing current required to blow a fuse constructed in accordance with this invention as a function of the thickness of the dielectric beneath the fuse. The line in FIG. 3 depicts characteristics of an hourglass shaped fuse and the characteristics of a rectangular fuse. The parameters of the fuses are as follows:

|  | Hourglass | Rectangular |
| --- | --- | --- |
| Material | Platinum silicide, 23 ± 2.3% silicon by weight | Platinum silicide, 23 ± 2.3% silicon by weight |
| Fuse Length | 5–6 microns | 4–5 microns |
| Fuse Width | 1.5 microns | 1.5 microns |
| Fuse Thickness | 650Å | 650Å |

Use of a thick oxide layer, such as layer 2, minimizes heat flow away from the fuse 3 due to low thermal conductivity of the oxide layer as compared to the thermal conductivity of the underlying substrate by reducing the thermal gradient driving force for the heat flow (that is, the magnitude of the thermal gradient decreases as the thickness of the layer 2 increases). Thus, layer 2 should be as thick as possible in any given circuit regardless of the type of fuse with which it is used. Fuses suitable for use in accordance with this feature of the invention include, but are not limited to, titanium-tungsten, nickel-chromium (nichrome), and polycrystalline silicon in addition to the preferred platinum silicide.

Figure 8:
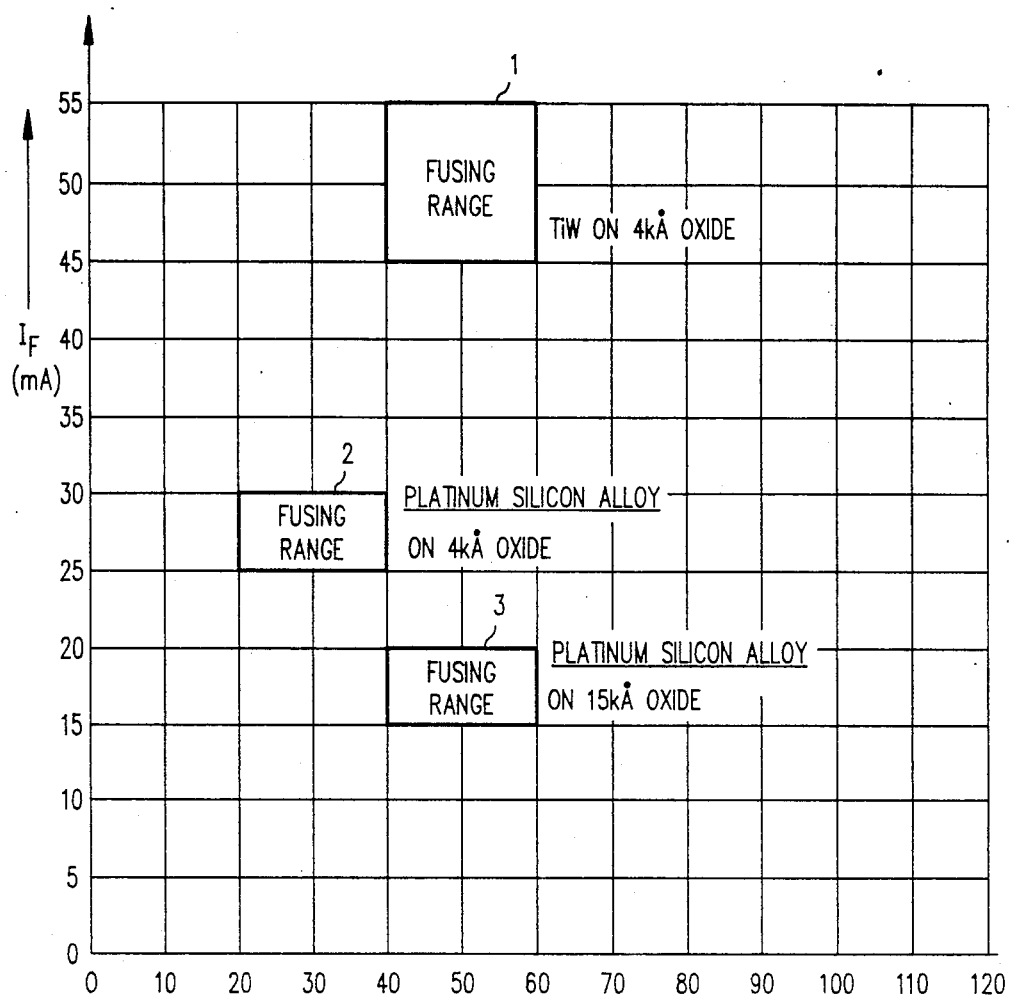
FIG. 8 shows ranges of fusing current and fuse resistance for two prior art fuse structures and for the current invention.

FIG. 8 shows ranges of fusing current ($I_F$) and fuse resistance ($R_F$) for two prior art fuse structures, (boxes 1 and 2), and for those of the current invention (box 3). Box 1 shows the range of current and resistance for fusing TiW fuses formed on a layer of oxide 4,000 angstroms thick in which an air gap is present above the fuse. As FIG. 8 shows, these TiW fuses have a typical resistance of 40–60 ohms and fuse at a current of 45–55 mA. Box 2 shows the range of current and resistance for fusing sputtered platinum-silicon alloy fuses also formed on a layer of oxide 4,000 angstroms thick in which an air gap is present above the fuse. A comparison of boxes 1 and 2 shows that the lower melting platinum-silicon alloy material provides a significant advantage, requiring a fusing current of only 25–30 mA. Box 3 shows the range of current and resistance for fusing sputtered platinum-silicon alloy fuses formed on a thicker layer of oxide, 15,000 angstroms in this case, in which an air gap is present above the fuse. The thick oxide reduces the fusing current an additional 30% below that of the platinum-silicon alloy fuses on thin dielectric shown in box 2, given a fusing current for the preferred embodiment of 15-20 mA.

Figure 9A:
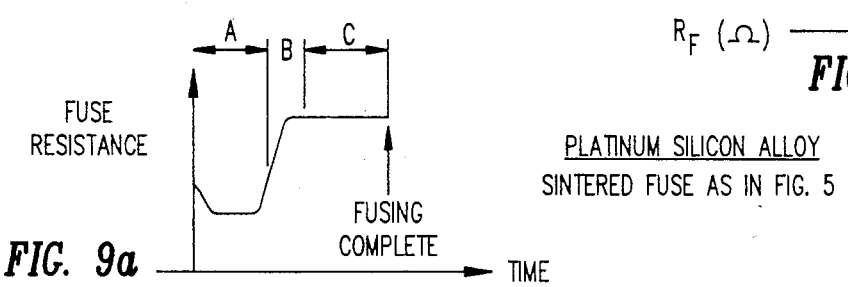
FIG. 9a and 9b show a comparison of dynamic resistance and fusing time between prior art fuses and those of the current invention.
Figure 9B:
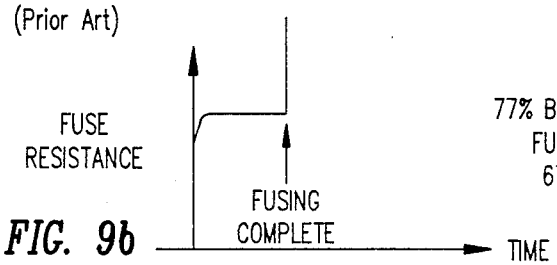

FIGS. 9a and 9b show a comparison between the resistance of sintered and sputtered platinum-silicon alloy fuses. The sintered fuse of FIG. 9a shows instability in resistance. The sputtered fuse of FIG. 9b shows neither the early decrease in resistance nor the subsequent large increase in resistance before fusing is complete. The increased resistance in portion C of FIG. 9a means that higher voltage will have to be provided in order to reliably open such a fuse. Also FIGS. 9a and 9b show the sputtered platinum-silicon alloy fuse achieves complete fusing in a consideraby shorter time than the prior art sintered platinum-silicon alloy fuse, primarily due to the resistance stability of the homogeneous sputtered film. The shorter fusing time is important to high reliability in the situation where a fixed time is provided for applying the fusing pulse, since it is certain that the time required for fusing to complete will be shorter than the time allowed for the fusing pulse.

Also the smaller current requirement of the fuses of this invention allows for reduced size of other circuit components. In a PROM or programmable logic array, a fuse is generally provided in series with a transistor. The transistor must have sufficient current capacity to carry the current needed to open the fuse. Reducing the current requirement for opening the fuse means that the adjacent transistor may be required to carry less current and if so the transistor can be made smaller. For a chip having 64,000 fuses and transistors, this smaller size can provide a significant savings in chip area.

While fuses made from platinum-silicon alloys are known in the prior art, prior known methods of fabricating fuses have not provided fuses having a uniform, homogeneous composition which are achieved due to the use of sputtering from a composite target, as described above. This uniformity and homogeneity is important because it provides for very low fusing voltage and current to achieve highly reliable fuse-blowing. Moreover, none of the prior known silicide fuses have used a platinum-silicon composition comprising 23±2.3 weight percent silicon, the preferred eutectic composition for high performance, low fusing energy fusible links.

While a preferred embodiment of the present invention has been described in detail, it is to be understood that the invention is not limited to the embodiments disclosed, but is capable of numerous rearrangements and modifications and substitutions without departing from the spirit and scope thereof. Accordingly, it is intended that the scope of the present invention not be limited to the embodiment described but be determined by a reference to the claims hereinafter provided.

I claim:

1. In an integrated circuit structure, a fusible link structure comprising:
    a first layer of dielectric material;
    a resistive film comprising the platinum-silicide eutectic having approximately 23 weight percent silicon and having uniform composition throughout its thickness deposited on said first layer of dielectric material; and
    a second layer of dielectric material deposited on said resistive film.

2. A fusible link structure as in claim 1 in which said first layer of dielectric material has sufficient thickness and sufficiently low conductivity to reduce the transfer of heat from said resistive film through said first layer.

3. A fusible link structure as in claim 2 in which said first layer of dielectric material comprises a silicon oxide.

4. A fusible link structure as in claim 2 in which said first layer of dielectric material comprises a lower portion of silicon oxide and an upper portion of silicon nitride.

5. A fusible link structure as in claim 2 in which said first layer of dielectric material comprises polyimide.

6. A fusible link structure as in claim 2 in which said first layer of dielectric material is at least 10,000 Å thick.

7. A fusible link structure as in claim 1 having a resistance within the range of approximately 35 to 70 ohms.

8. A fusible link structure as in claim 1 able to be opened by a current within the range of approximately 15 to 20 milliamperes and a voltage within the range of approximately 2.3 to 2.8 volts.

9. A fusible link structure as in claim 1 further comprising:
    a first conductive material in contact with portions of said resistive film; and
    a second conductive material placed in contact with said first conductive material for passing a current through said resistive film;
    said first conductive material serving to inhibit the material of said second conductive material from diffusing into said resistive film.

10. A fusible link structure as in claim 9 in which said first and second conductive materials are metal.

11. A fusible link structure as in claim 10 in which said first conductive material is a metal which will not diffuse into platinum-silicide.

12. A fusible link structure as in claim 11 in which said first conductive material comprises an alloy of tungsten and titanium.

13. A fusible link structure as in claim 12 in which said alloy of tungsten and titanium comprises approximately 10% titanium by weight.

14. A fusible link structure as in claim 12 in which said second conductive material comprises aluminum.

15. A fusible link structure as in claim 1 in which said film is formed by the process of sputtering from a target, and subsequently sintered to achieve decreased resistance of said film and said first layer of dielectric material comprises a silcon oxide.

* * * * *

UNITED STATES PATENT AND TRADEMARK OFFICE
CERTIFICATE OF CORRECTION

PATENT NO. : 4,796,075

DATED : January 3, 1989

INVENTOR(S) : Ralph G. Whitten

It is certified that error appears in the above-identified patent and that said Letters Patent is hereby corrected as shown below:

Col. 1, line 32, change "PAL" to --PAL®--.

Col. 1, line 34, change "Monolithic Memories, Inc., of Santa Clara" to --Advanced Micro Devices, Inc. of Sunnyvale--.

Col. 1, line 36, change "Monolithic Memories, Inc." to --Advanced Micro Devices, Inc.--.

Col. 1, line 50, change "selected1" to --selected--.

Col. 3, line 34, change "Aril" to --April--.

Col. 6, line 26, change "PtSi" to --Platinum Silicon Alloy--.

Col. 6, line 51, change "PtSi" to --Platinum Silicon Alloy--.

Signed and Sealed this

Tenth Day of September, 1991

Attest:

HARRY F. MANBECK, JR.

Attesting Officer

Commissioner of Patents and Trademarks